United States Patent [19]
Farnworth et al.

[11] Patent Number: 5,893,726
[45] Date of Patent: Apr. 13, 1999

[54] SEMICONDUCTOR PACKAGE WITH PRE-FABRICATED COVER AND METHOD OF FABRICATION

[75] Inventors: Warren M. Farnworth, Nampa; David R. Hembree, Boise; Derek Gochnour, Boise; Salman Akram, Boise; John O. Jacobson, Boise; James M. Wark, Boise; Steven G. Thummel, Boise, all of Id.

[73] Assignee: Micron Technology, Inc., Boise, Id.

[21] Appl. No.: 08/990,866

[22] Filed: Dec. 15, 1997

[51] Int. Cl.[6] .................... H01L 21/44; H01L 21/48; H01L 21/50
[52] U.S. Cl. .................... 438/108; 438/106; 438/107
[58] Field of Search .................... 438/108, 107, 438/106

[56] References Cited

U.S. PATENT DOCUMENTS

| | | | |
|---|---|---|---|
| 4,169,642 | 10/1979 | Mouissie | 339/17 |
| 4,873,615 | 10/1989 | Grabbe | 361/395 |
| 5,015,191 | 5/1991 | Grabbe et al. | 439/71 |
| 5,447,886 | 9/1995 | Rai | 438/108 |
| 5,656,549 | 8/1997 | Woosley et al. | 438/118 |
| 5,710,071 | 1/1998 | Beddingfield et al. | 438/108 |
| 5,723,369 | 3/1998 | Barber | 438/108 |

OTHER PUBLICATIONS

Van Zant, Peter, *Microchip Fabrication—A Practical Guide to Semi-conductor Processing*, pp. 482–483, 1990.

*Primary Examiner*—Kevin M. Picardat
*Assistant Examiner*—Deven Collins
*Attorney, Agent, or Firm*—Stephen A. Gratton

[57] ABSTRACT

A semiconductor package includes a substrate having one or more dice mounted thereto, and a cover adapted to protect and form a sealed space for the dice. The cover can be pre-fabricated of molded plastic, or stamped metal, and attached to the substrate using a cured seal. A hole can also be provided through the substrate to permit pressure equalization during formation of the seal. The cover can be prefabricated in an enclosed configuration for attachment directly to the substrate, or in a planar configuration for attachment to a peripheral ridge on the substrate. In either embodiment, the cover is removable to permit defective dice to be replaced or repaired.

23 Claims, 3 Drawing Sheets

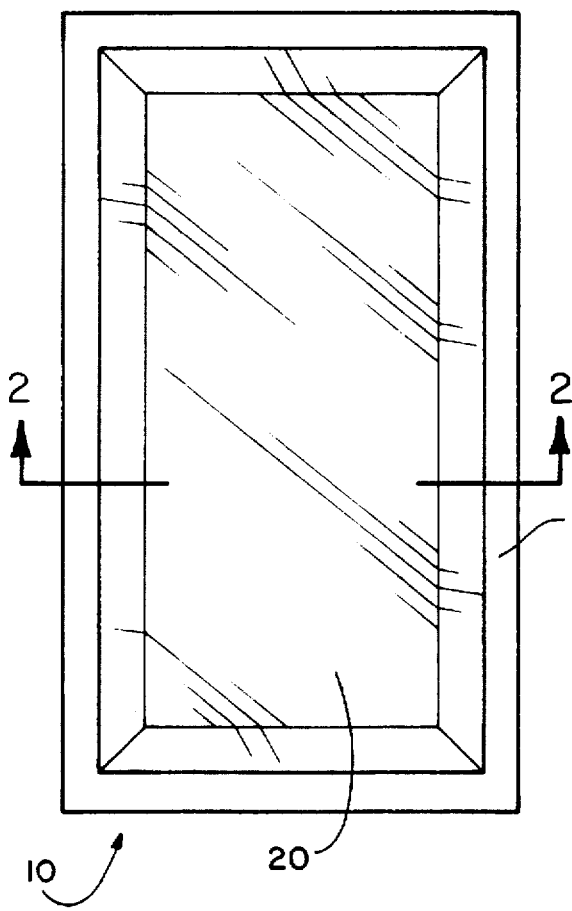
FIGURE 1
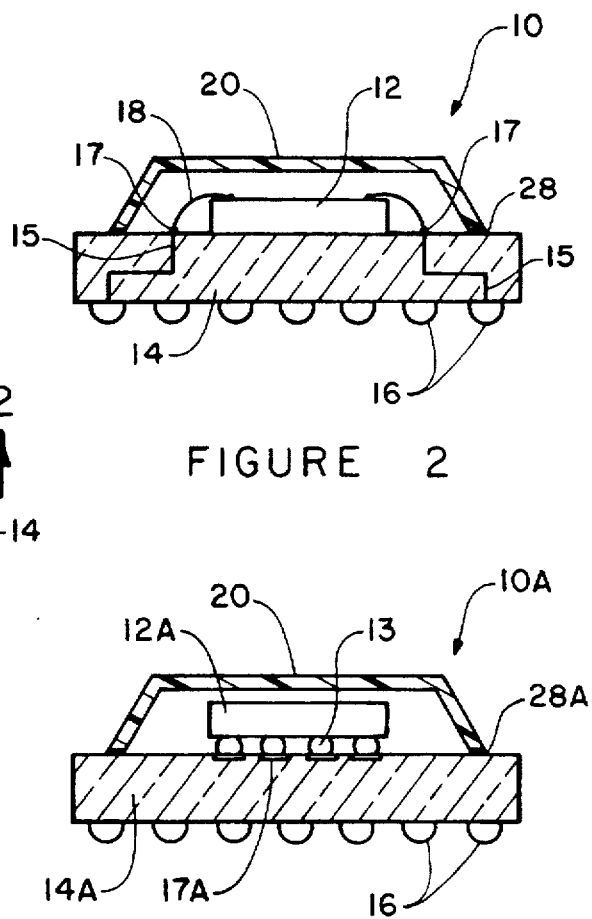
FIGURE 2
FIGURE 2A
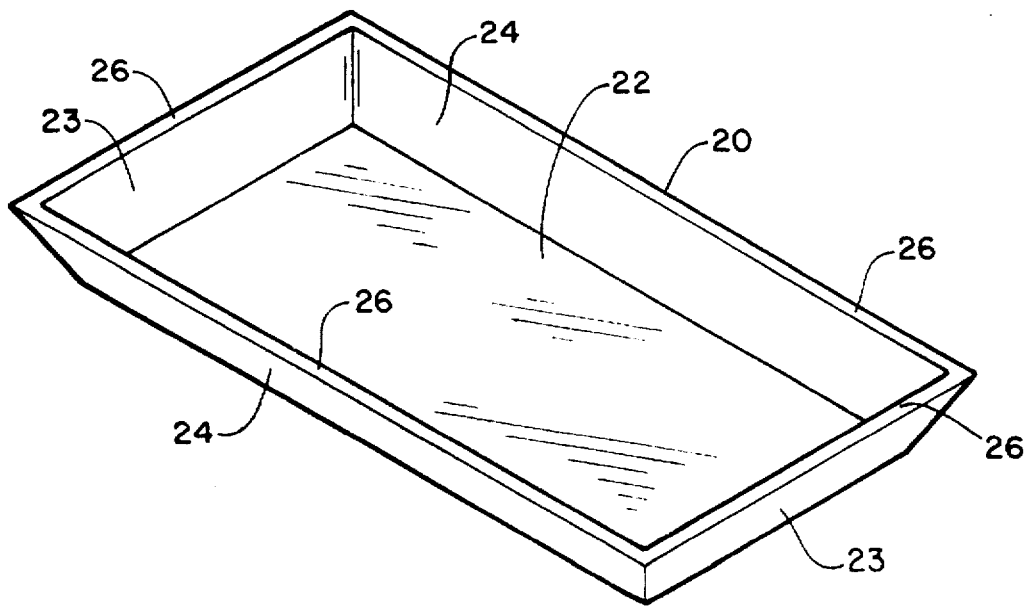
FIGURE 3

SEMICONDUCTOR PACKAGE WITH PRE-FABRICATED COVER AND METHOD OF FABRICATION

FIELD OF THE INVENTION

This invention relates generally to semiconductor packaging. More particularly, this invention relates to a semiconductor package including a pre-fabricated cover for protecting dice on a substrate which is removable to permit defective dice to be removed or replaced.

BACKGROUND OF THE INVENTION

One type of semiconductor package is referred to as a "multi chip module". These packages include semiconductor dice mounted directly to a substrate, such as a printed circuit board. The dice can be bare dice or contained in chip scale packages. In addition, the dice can be mounted in a chip-on-board configuration, or in a flip chip configuration. With chip-on-board mounting, the dice are back bonded to the substrate, and wire bonds are formed between the bond pads on the dice, and corresponding bonding sites on the substrate. With flip chip bonding, the dice are mounted circuit side down, with the bond pads on the dice soldered to solder wettable pads on the substrate.

Typically, a multi chip module will be arranged in a particular electronic configuration. For example, a single-in-line memory module (SIMM) can include an array of interconnected DRAMs, with edge connectors on the substrate that include dedicated input/output ports for the module.

Also with multi chip modules, an encapsulant layer can be used to protect and seal the dice on the substrate. For example, the encapsulant material can be applied directly to the dice and substrate in the form of a "glob top". Glob top encapsulation materials typically comprise electrically insulating polymers such as epoxies, silicones and polyimides. The glob top can be formed by dispensing a required volume of viscous material over the dice and portions of the substrate. A fence can also be formed on the substrate, as a mold for defining a perimeter of the glob top. The glob top can be formed over individual dice and associated wire bonds, or can be formed over groups of dice. Following dispensing, the encapsulation material can be cured at an elevated temperature (e.g. 165° C.) for a suitable period of time (e.g. 60 minutes). Thereafter, the dice can be subjected to testing, to evaluate the electrical characteristics of the module prior to assembly in an electronic device.

One limitation of a glob top encapsulation process is that the curing process is relatively time consuming. This increases the length of the packaging process and decreases package throughput. Also, the glob top dispensing and curing apparatus can be relatively expensive to install and operate.

Another limitation of glob top encapsulation is that following encapsulation, the dice cannot be removed from the substrate. This essentially prevents defective dice from being replaced or repaired. Accordingly, some substrates are provided with one or more replacement sites on which replacement dice can be mounted. The defective dice are then electronically by-passed. However, replacement sites increase the size of the substrate and add expense to the module. Also the defective dice may sometimes be repairable but cannot be removed for repair because of the glob top.

In view of the foregoing, it would be advantageous to utilize a cover to protect and seal dice on a substrate, which can be easily removed to permit defective dice to be repaired or replaced. Accordingly, the present invention is directed to a semiconductor package that includes a pre-fabricated protective cover for dice mounted to a substrate. Still further, the present invention is directed a method for fabricating electronic assemblies, such as multi chip modules and BGA connects, that include one or more dice on a substrate.

SUMMARY OF THE INVENTION

In accordance with the present invention an improved semiconductor package, and a method for fabricating the package are provided. The package, broadly stated, comprises: a substrate; one or more semiconductor dice mounted to the substrate; a cover configured to form an enclosed space for the dice; and a seal formed between the cover and the substrate, configured to attach the cover to the substrate and seal the enclosed space.

The cover can comprise a pre-fabricated component such as a molded plastic member, or a stamped metal member attached directly to the substrate using the seal. In an illustrative embodiment the cover has an enclosing configuration with a top portion, end walls and sidewalls shaped to form the enclosed space. In an alternate embodiment, a ridge can be formed on the substrate, and a planar cover attached to the ridge with the seal formed therebetween.

The seal can comprise a curable elastomeric material, such as a silicone adhesive, a room temperature vulcanizing material, or a thermosetting resin. With an elastomeric seal material, thermal stresses between the cover and the substrate can be absorbed. The seal can also comprise a relatively incompressible material such as a thermosetting resin, an instant curing material such as a cyanoacrylate adhesive, or an anaerobic acrylic adhesive.

The package can be in a configuration of a single die mounted to a ball grid array (BGA) substrate. Alternately, the package can be in a configuration of a multi chip module, such as a SIMM module. In the multi chip embodiment, one or more covers can be used to encompass a portion or all of the dice on the substrate, or multiple covers can be used to encompass individual dice. In either embodiment, the cover is removable to permit repair or replacement of defective dice.

The method for fabricating the semiconductor package, broadly stated, comprises: providing a substrate with one or more dice mounted thereto; providing a pre-fabricated cover configured to form an enclosed space for the dice; and then forming a seal between the cover and substrate to attach the cover to the substrate and seal the space.

If desired, the attaching step can be performed in stages, wherein the cover is initially tacked to the substrate, and functionality tests are performed on the dice. Following testing, the tacked cover can be easily removed for repairing or replacing defective dice. If the dice are determined to be acceptable, a remainder of the seal can be formed. The attaching step can also include the step of providing a hole through the substrate, to permit pressure equalization in the sealed space during seal formation. Following seal formation, the hole can be sealed with a cured elastomer or a reflowed metal.

BRIEF DESCRIPTION OF THE DRAWINGS

FIG. 1 is a plan view of a package constructed in accordance with the invention comprising a BGA substrate and a wire bonded die protected by a cover.

FIG. 2 is a cross sectional view of the package taken along line 2—2 of FIG. 1.

FIG. 2A is a cross sectional view equivalent to FIG. 2 of an alternate embodiment package with a flip chip mounted die.

FIG. 3 is a perspective view of one embodiment of the cover of the present invention.

DETAILED DESCRIPTION OF THE PREFERRED EMBODIMENT

Figure 4:
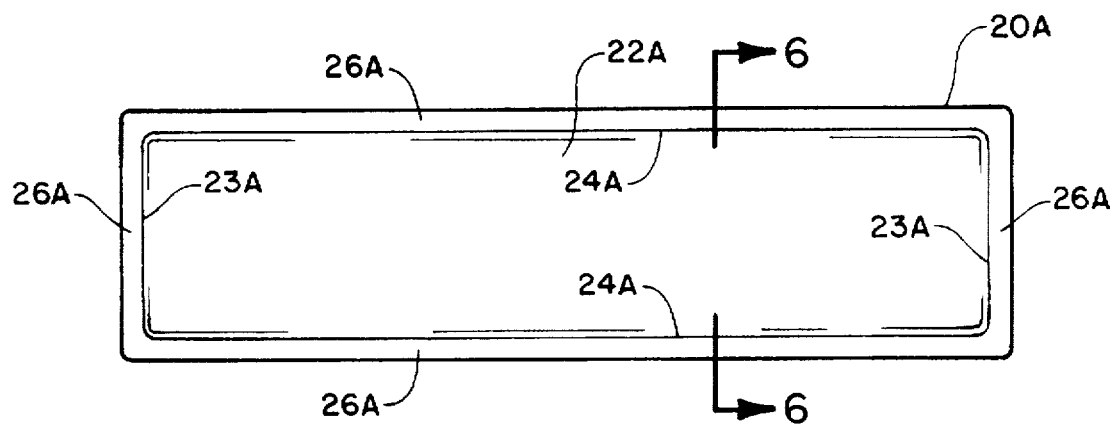
FIG. 4 is a bottom view of another embodiment of the cover of the present invention.

Referring to FIGS. 1 and 2, a package 10 constructed in accordance with the invention is illustrated. The package 10 includes a single semiconductor die 12 mounted to a substrate 14. The semiconductor die 12 can be in the form of a conventional bare die, or can be in the form of a chip scale package. The substrate 14 comprises an electrically insulating material such as ceramic, plastic, or FR-4, or a semiconducting material such as silicon. In the case of a semiconducting material insulating layers are preferably formed to insulate the bulk of the substrate from other electrical components.

As shown in FIG. 2, the substrate 14 includes an array of external contacts 16. In this embodiment the external contacts 16 comprise metal balls in a dense array, such as a ball grid array (BGA), or fine ball grid array (FBGA). The external contacts 16 are in electrical communication with conductive traces and other circuit components formed on the substrate 14. For example, internal traces 15 can be formed in the substrate 14 in electrical communication with the external contacts 16 and with bonding sites 17 on a face of the substrate 14.

As also shown in FIG. 2, the die 12 is mounted to the substrate 14 in a chip on board configuration. In this configuration the die 12 can be back bonded to the substrate 14 using a suitable adhesive. In addition, wires 18 can be bonded to bond pads on the die and to the bonding sites 17 on the substrate 10. Alternately, as shown in FIG. 2A, a package 10A can include a bumped semiconductor die 12A, which is flip chip mounted to a substrate 14A. In the flip chip package 10A, solder bumps 13 on the die 12A are bonded to corresponding bonding sites 17A on the substrate 14A.

Referring again to FIG. 2, the package 10 also includes a protective cover 20. The cover 20 comprises a separate pre-fabricated member attached to the substrate 10. In addition, the cover 20 encloses the die 12 without being in physical contact therewith, to form an enclosed space bounded by the cover 20 and the substrate 14. In the embodiment illustrated in FIGS. 1–3, the cover 20 comprises a pre-molded plastic member. The pre-molded plastic cover 20 can comprise a thermoplastic plastic, a thermosetting plastic or a liquid crystal polymer. Exemplary materials include polyetherimide (PEI) and polyphenyl sulfide (PPS).

As clearly shown in FIG. 3, the cover 20 includes a top portion 22, opposed end walls 23, and opposed side walls 24 depending therefrom. The end walls 23 and side walls 24 can be generally perpendicular to the top portion 22, or can form an obtuse angle with the top portion 22 substantially as shown. In addition, the end walls 23 and side walls 24 define a continuous peripheral rim 26. The peripheral rim 26 can be sized to surround the die 12 and a portion of the substrate 10, such as the wire bonding area thereof. With this configuration, the top portion 22, end walls 23 and side walls 24 of the cover 20 completely surround and form an enclosed space for the die 12.

Figure 5:
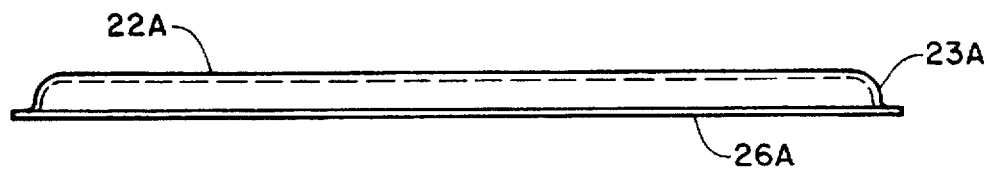
FIG. 5 is a side view of FIG. 4.
Figure 6:
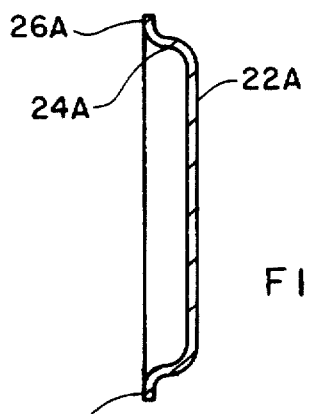
FIG. 6 is a cross sectional view taken along section line 6—6 of FIG. 4.

Referring to FIGS. 4–6, rather than being pre-molded plastic, a cover 20A can be pre-fabricated of a metal, such as aluminum or alloys thereof. For example, the cover 20A can be stamped from a flat sheet of metal in a shape for enclosing the die 12. In addition, the cover 20A can be anodized to create different colors, and can be embossed with identifying indicia, such as logos. In addition to enclosing and protecting the die 12, the metal cover 20A also functions as a heat sink to dissipate heat generated by the die 12 and surrounding substrate 10. As with the previous embodiment, the cover 20A includes a top portion 22A, opposed end walls 23A, opposed side walls 24A and a continuous peripheral rim 26A.

Referring again to FIG. 2, the package 10 also includes a seal 28. The seal 28 secures the cover 20 to the substrate 14, and forms an air-tight, hermetic seal for the space encompassed by the cover 20. The seal 28 protects and seals the die from contaminants such as particles and gases. Preferably the seal 28 comprises a curable elastomer, such as a silicone adhesive, or a room temperature vulcanizing material. One suitable adhesive is "ZYMET" silicone elastomer manufactured by Zymet, Inc., East Hanover, N.J. An advantage of the seal 28 being formed of an elastomeric material is that the compressibility of the material helps to absorb thermal stresses due to differences in thermal expansion between the cover 20 and substrate 14.

The seal 28 can also comprise a relatively incompressible material such as a thermosetting resin or an instant curing elastomer. Representative instant curing adhesives include cyanoacrylate adhesives and anaerobic acrylic adhesives. Cyanoacrylate adhesives are commercially available from Loctite Corporation, Rocky Hill, Conn. under the trademarks "410" or "416".

The seal 28 can be applied to the rim 26 of the cover 20 as a continuous bead of a viscous material. The viscous material can be applied using a suitable dispensing apparatus such as a needle or nozzle. Following dispensing, the viscous material can be cured such as by heating, or adding a catalyst to initiate polymerization of the viscous material. As thus assembled, the cover 20 can be readily removed from substrate 14 by cutting the seal 28 should repair or replacement of the die 12 become necessary. Once such repair or replacement is accomplished, the cover 20 can then be reattached to substrate 14 with a similarly formed seal.

The seal 28 can also be formed in a staged process wherein the cover 20 can be initially tacked to the substrate 14 with a minimal quantity of adhesive. For example, dots of adhesive can be applied at the corners of the cover 20. The die 12 can then be tested with the cover 20 in a tacked configuration. Should the die 12 be defective, the tacked cover 20 can be easily removed for replacing the die 12. Once the die 12 is confirmed to be a good die, the remainder of the seal 28 can be formed by applying a continuous bead of adhesive between the cover 20 and substrate 14.

Figure 7:
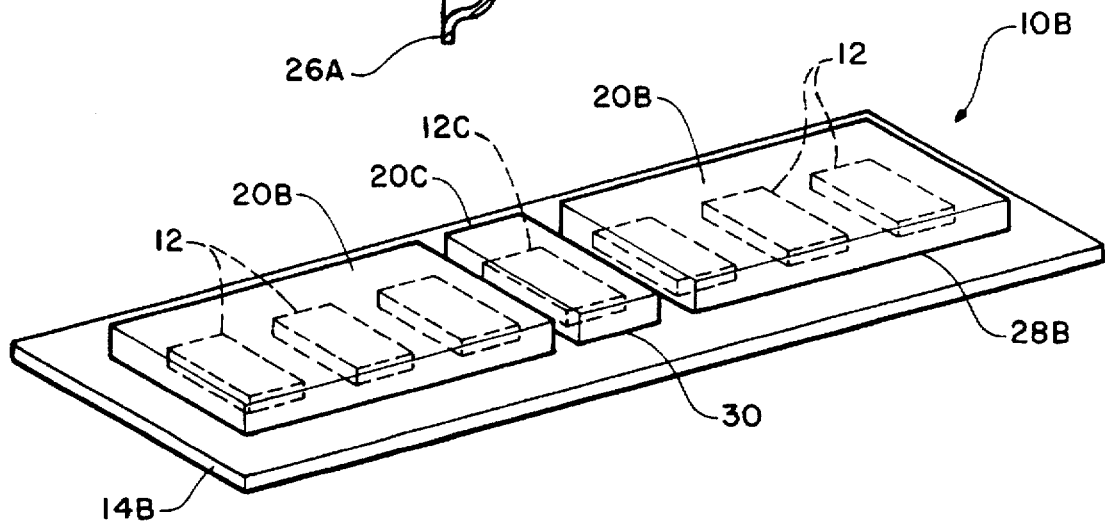
FIG. 7 is a perspective view of an alternate embodiment package in the form of a multi chip module.

Referring to FIG. 7, an alternate embodiment package 10B in the form of a multi chip module, is illustrated. The package 10B includes multiple semiconductor dice 12 mounted to a substrate 14B. The substrate 14B includes a plurality of separate die mounting sites for the dice 12. The dotted lines in FIG. 7 represent the dice 12 and the die mounting sites on the substrate 14B. The dice 12 can be mounted to the substrate 14B in a chip on board configuration, or in a flip chip configuration as previously described. The substrate 14B also includes other circuit components such as conductive traces and external contacts that form a required circuit configuration for the module. In addition, the package 10B includes multiple covers 20B, each configured to protect a group of dice 12. The covers 20B can be formed substantially as previously described for molded plastic cover 20 (FIG. 3) or metal cover 20A (FIGS. 4–6) but sized to cover multiple dice. In addition, the covers 20B are attached to the substrate using a seal 28B substantially as previously described for seal 28 in FIG. 2.

The package 10B also includes a replacement die mounting site 30. The replacement die mounting site 30 is configured to electrically attach a replacement die 12C to the substrate 14B. The replacement die 12C can be used to replace any of the dice 12 that have been determined to be defective. In addition, the package 10B includes a replacement cover 20C for protecting and sealing the replacement die 12C.

Figure 8:
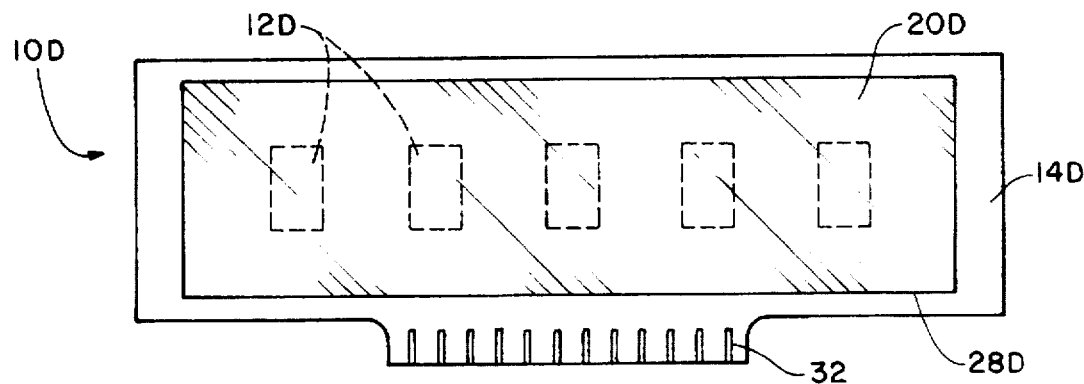
FIG. 8 is a perspective view of another alternate embodiment package in the form of a SIMM module.
Figure 9:
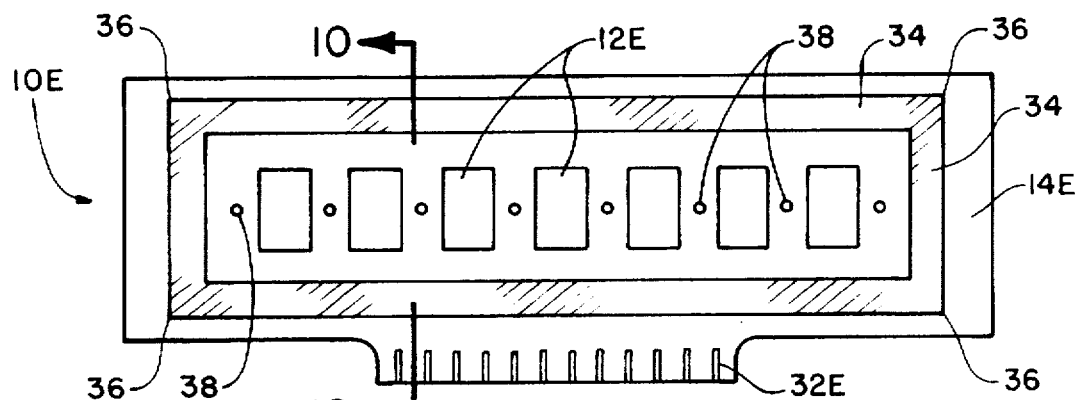
FIG. 9 is a perspective view of another alternate embodiment package with parts removed, illustrated during fabrication of the package.

Referring to FIG. 8, an alternate embodiment package 10D in the form of a SIMM module, is illustrated. The package 10D includes multiple dice 12D in the form of DRAMs mounted to a substrate 14D, substantially as previously described. The substrate 14D includes an edge connector 32 with input/output ports for the package 10D. The package 10D also includes a single cover 20D that protects the dice 12D mounted to the substrate 14D. The cover 20D can be formed substantially as previously described for molded plastic cover 20 (FIG. 3), or metal cover 20A (FIGS. 4–6), but sized to cover all of the dice 12D on the substrate 14D. In addition, the cover 20D can be attached to the substrate 14D using a seal 28D substantially as previously described for seal 28 in FIG. 2.

In addition to protecting the dice 12D, the cover 20D also increases the structural integrity of the substrate 14D thereby inhibiting seal failure in the seal 28D. Further, a single cover requires less handling during assembly than multiple covers.

Referring to FIGS. 9–12 steps in the construction of an alternate embodiment package 10E are illustrated. The package 10E includes a substrate 14A. Initially the dice 12E can be mounted to the substrate 14E in a chip on board, or a flip chip configuration as previously described. In addition, a ridge 34 can be formed on the substrate 14A. The ridge 34 has a peripheral outline corresponding to that of a cover 20E (FIG. 12) for the package 10E.

The ridge 34 can comprise a polymer material applied to the substrate 14A and then cured. Suitable materials include silicone and room temperature vulcanizing (RTV) elastomers. The ridge 34 can also be formed integrally with the substrate 14A using an etching, molding or machining process. For example, with the substrate 14A formed of laminated ceramic, the ridge 34 can comprise an integral feature of the substrate 14A. With the substrate 14A formed of molded plastic or FR-4, the ridge 34 can be molded on the substrate 14A. The ridge 34 can also comprise a separate member such as a stamped or molded piece that is fabricated separately and then attached to the substrate 14A with an adhesive substantially as previously described for forming seal 28.

Still further, the ridge 34 can comprise a thick film resist deposited on the substrate 14A to a desired thickness, photopatterned to define the ridge, and then developed to form the ridge. A suitable negative tone resist formulation is sold by Shell Chemical under the trademark "EPON RESIN SU-8". Such a resist can be deposited to a thickness of from about 5–50 mils. In addition, the resist can be developed with high aspect ratio features to form the ridge 34 with almost vertical sidewalls. A conventional resist coating apparatus, such as a spin coater, or a meniscus coater, can be used to blanket deposit the resist onto the substrate 14A. The deposited resist can then be "prebaked" at about 95° C. for about 15 minutes and exposed in a desired pattern using a conventional UV aligner with a dose of about 165 mJ/cm$^2$. Developing can be accomplished with a solution of PGMEA (propyleneglycol-monomethylether-acetate). This can be followed by a "full cure" comprising a hard bake at about 200° C. for about 30 minutes.

Figure 11:
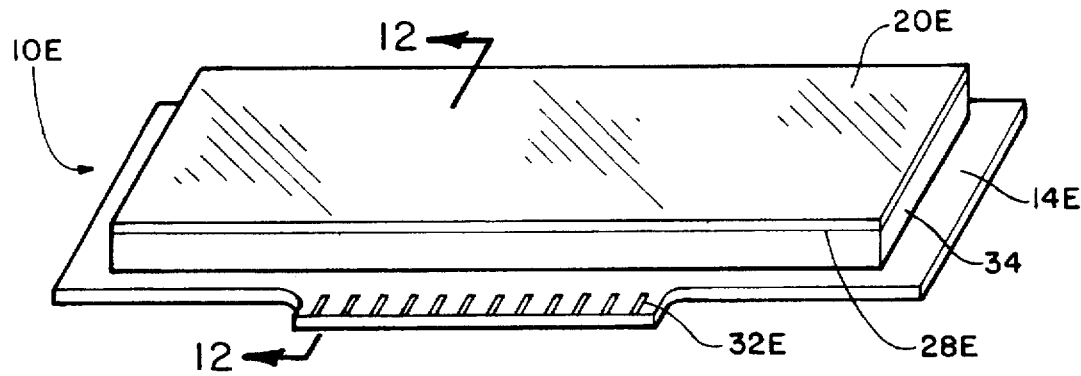
FIG. 11 is a perspective view of the completed alternate embodiment package initially illustrated in FIG. 9.
Figure 10:
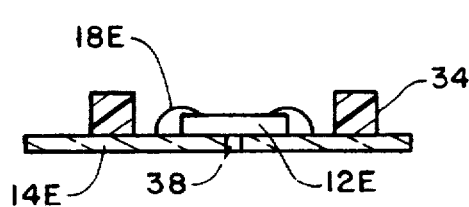
FIG. 10 is a cross sectional view taken along section line 10—10 of FIG. 9.
Figure 12:
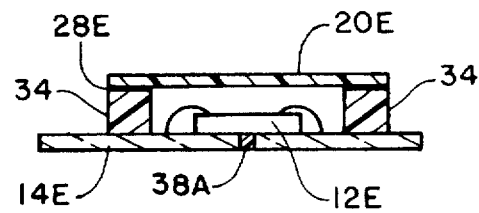
FIG. 12 is a cross sectional view taken along section line 12—12 of FIG. 11.

As shown in FIG. 10, a height of the ridge 34 can be greater than a height of the mounted dice 12 and associated bond wires 18E. With this height, a continuous sealed enclosure can be formed around the perimeter of the dice 12 when the cover 20E (FIG. 12) is attached to the ridge 34. As shown in FIGS. 11 and 12, the cover 20E can be attached to the ridge 34 with a seal 28E formed therebetween substantially as previously described.

The seal 28E can also be formed between the cover 20E and the ridge 34 using a two step process. With the dice 12E mounted to the substrate 14E, the cover 20E can be tacked to the ridge 34 without forming a seal by means of dots of adhesive formed at intervals along the ridge 34 such as at the corners 36 thereof. Once the adhesive dots cure, the dice 12E on the substrate 14E can be subjected to testing, such as functionality and burn-in testing. For example test signals can be applied through edge connector 32E (FIG. 11) on the substrate 14E to the integrated circuits on the dice 12E. If the dice 12E are determined to be properly functional, then a bead of adhesive can be applied to the juncture of the cover 20E and ridge 34 and allowed to cure to form the continuous seal 28E therebetween. If a defective die is located, the cover 20E can easily be removed from ridge 34, such as by slitting the adhesive dots thereby permitting access to the dice 12E for repair, or replacement.

When the cover 20E is secured to the ridge 34, a differential pressure may exist between the trapped gases in the area bounded by the cover 20E and the ridge 34, and the ambient atmosphere. This pressure differential can result in bubbles or holes being formed in the seal 28E. To ensure the integrity of the seal 28E, the substrate 32E can be formed or provided with vent holes 38. The vent holes 38 can provide an exit for trapped gases or alternately provide an entrance for ambient gases during the seal formation process. Once the seal 28E has been formed, the vent holes 38 can be sealed by filling the vent holes 38 with a seal material, such as a polymer, an epoxy or a metal. For example, the vent holes 38 can be sealed with a curable material such as those previously described for forming the seal 28E. The vent holes 38 can also be sealed with a metal such as solder, using a reflow process. The vent sealing process forms sealed vent holes 38A (FIG. 12).

Thus the invention provides an improved semiconductor package and a method for fabricating the package. Although preferred materials have been described, it is to be understood that other materials may also be utilized. Furthermore, although the invention has been described with reference to certain preferred embodiments, as will be apparent to those skilled in the art, certain changes and modifications can be made without departing from the scope of the invention as defined by the following claims.

We claim:

1. A method for assembling a semiconductor package comprising:

providing a substrate comprising a plurality of external contacts;

mounting a semiconductor die to the substrate in electrical communication with the external contacts;

providing a cover configured for attachment to the substrate to enclose the die;

applying a seal material to the cover or to the substrate; and placing the cover on the substrate, with the cover enclosing the die, and with the seal material attaching the cover to the substrate, and forming a seal between the cover and the substrate.

2. The method of claim 1 further comprising following the placing step, testing the die, removing the cover, replacing the die and forming a second seal between the cover and the substrate.

3. The method of claim 1 further comprising providing the substrate with a hole and permitting gas to exit or enter through the hole during the placing step.

4. The method of claim 1 wherein the cover comprises a material selected from the grout consisting of plastic and metal.

5. The method of claim 1 wherein the external contacts comprise a ball grid array.

6. The method of claim 1 further comprising during the placing step, curing the seal material.

7. A method for assembling a semiconductor package comprising:

providing a substrate having a hole therethrough;

mounting a plurality of semiconductor dice to the substrate proximate to the hole;

providing a cover configured for attachment to the substrate to enclose the dice in a space;

applying seal material to the cover or to the substrate, the seal material comprising a curable material;

placing the cover on the substrate and over the dice;

curing the seal material to form a seal between the cover and substrate, to seal the space, and to attach the cover to the substrate; and permitting gas to exit or enter through the hole during the placing and curing steps.

8. The method of claim 7 further comprising sealing the hole following the permitting step.

9. The method of claim 7 wherein the seal material comprises a material selected from the group consisting of silicone adhesives, room temperature vulcanizing materials, thermosetting resins, cyanoacrylate adhesives, and anaerobic acrylic adhesives.

10. The method of claim 7 further comprising following the placing step, testing the dice, removing the cover, replacing at least one die, and forming a second seal between the cover and substrate.

11. A method for assembling a semiconductor package comprising:

providing a substrate comprising a plurality of semiconductor dice;

providing a cover configured for attachment to the substrate to enclose the dice;

applying a first quantity of adhesive material to the cover or to the substrate;

tacking the cover to the substrate using the first quantity of adhesive material;

following the tacking step, testing the dice; and following the testing step, applying a second quantity of adhesive material between the cover and the substrate to form a seal therebetween.

12. The method of claim 11 wherein the first quantity of adhesive material comprises adhesive dots.

13. The method as claimed in claim 11 wherein the second quantity of adhesive material comprises a curable material.

14. A method for assembling a semiconductor package comprising:

providing a substrate comprising a plurality of external contacts;

mounting a semiconductor die to the substrate in electrical communication with the external contacts;

applying an adhesive material to the substrate in a configuration that forms a ridge on the substrate surrounding the die;

providing a cover configured for attachment to the ridge to enclose the die and form a space;

placing the cover on the ridge; and curing the adhesive material to attach the cover to the ridge and seal the space.

15. The method of claim 14 wherein the adhesive material comprises a material selected from the group consisting of silicone, room temperature vulcanizing material, thermosetting resin, cyanoacrylate adhesive, and anaerobic acrylic adhesive.

16. The method of claim 14 wherein the ridge comprises an elastomeric material.

17. The method of claim 14 wherein the adhesive material comprises a heat curable material.

18. The method of claim 14 wherein the adhesive material comprises a deposited, patterned and developed resist.

19. A method for assembling a semiconductor package comprising:

providing a substrate;

forming a ridge on the substrate having a peripheral outline and comprising a curable adhesive material;

mounting a semiconductor die to the substrate within the peripheral outline of the ridge;

providing a cover configured for attachment to the ridge;

placing the cover on the ridge; and curing the adhesive material to attach the cover to the substrate and form a seal.

20. The method of claim 19 wherein the adhesive material comprises a material selected from the group consisting of silicone, room temperature vulcanizing material, thermosetting resin, cyanoacrylate adhesive, and anaerobic acrylic adhesive.

21. The method of claim 19 wherein the adhesive material comprises a deposited, patterned and developed resist.

22. The method of claim 19 wherein the ridge comprises a molded portion of the substrate.

23. The method of claim 19 wherein the ridge comprises a separate member attached to the substrate.

* * * * *